(12) United States Patent
Kurosawa et al.

(10) Patent No.: US 6,999,296 B2
(45) Date of Patent: Feb. 14, 2006

(54) VOLTAGE CONTROLLED VARIABLE CAPACITANCE DEVICE

(75) Inventors: Susumu Kurosawa, Kanagawa (JP); Yuki Fujimoto, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/767,105

(22) Filed: Jan. 29, 2004

(65) Prior Publication Data

US 2004/0184216 A1    Sep. 23, 2004

(30) Foreign Application Priority Data

Jan. 31, 2003   (JP)   ............................. 2003-024935

(51) Int. Cl.
*H01G 5/01*   (2006.01)
*H01G 7/00*   (2006.01)

(52) U.S. Cl. ....................................... 361/278; 361/280
(58) Field of Classification Search ......... 361/277–281
See application file for complete search history.

(56) References Cited

U.S. PATENT DOCUMENTS

| | | | |
|---|---|---|---|
| 6,212,056 B1 * | 4/2001 | Gammel et al. | 361/277 |
| 2002/0074589 A1 * | 6/2002 | Benaissa et al. | 257/312 |
| 2003/0085449 A1 * | 5/2003 | Adler | 257/595 |

FOREIGN PATENT DOCUMENTS

JP    2002-43872    2/2002

\* cited by examiner

*Primary Examiner*—Eric W. Thomas
(74) *Attorney, Agent, or Firm*—Scully, Scott, Murphy & Presser, P.C.

(57) ABSTRACT

A P type substrate is provided on a surface thereof with varactor elements. The varactor element has an N well formed on the surface of the P type substrate, and a gate insulating film is formed on the N well, with a polysilicon layer formed further thereon. On the other hand, the varactor element has an N well formed on the surface of the P type substrate, and a gate insulating film, greater than the gate insulating film in thickness, is formed on the N well. The polysilicon layer is then formed on the gate insulating film. Furthermore, the polysilicon layer is connected to a gate terminal, while the N well is connected to an S/D terminal via $N^+$ diffusion layers.

17 Claims, 3 Drawing Sheets

VOLTAGE CONTROLLED VARIABLE CAPACITANCE DEVICE

BACKGROUND OF THE INVENTION

1. Field of the Invention

The present invention relates to voltage controlled variable capacitance devices which have a plurality of varactor elements, and more particularly to a voltage controlled variable capacitance device which allows for selecting a voltage—capacitance characteristic.

2. Description of the Related Art

Voltage controlled variable capacitance devices have been conventionally used to control the oscillation frequency of the LC-VCO (Voltage Controlled Oscillator). In general, the voltage controlled variable capacitance device employs a MOS-type varactor element.

FIG. 1 is a cross-sectional view illustrating a conventional voltage controlled variable capacitance device. The conventional voltage controlled variable capacitance device shown in FIG. 1, which is incorporated into a semiconductor integrated circuit, employs a MOS-type varactor element. As shown in FIG. 1, the voltage controlled variable capacitance device is provided with a P type substrate 1, on a surface of which formed is an N well 2. The N well 2 is formed when the N well of a P channel MOSFET (Metal Oxide Semiconductor Field Effect Transistor) is formed in the semiconductor integrated circuit having the varactor element.

On the N well 2, there is provided a gate insulating film 11, while a polysilicon layer 9 is provided as an electrode on the gate insulating film 11. The polysilicon layer 9 is connected to a gate terminal 7. The gate insulating film 11 is formed, e.g., at the same time as the gate insulating film of an N channel MOSFET is formed, while the polysilicon layer 9 is formed, e.g., at the same time as the gate electrode of an N channel MOSFET is formed.

In addition, the N well 2 has $N^+$ diffusion layers 3 formed at two positions in the surface thereof. The $N^+$ diffusion layers 3 are formed so as to sandwich the polysilicon layer 9 when viewed in a direction perpendicular to the surface of the P type substrate 1 (hereinafter simply referred to as the vertical direction). The $N^+$ diffusion layers 3 are formed at the same time as the source/drain of the N channel MOSFET is formed. The $N^+$ diffusion layers 3 are connected to an S/D terminal 8. In this manner, the N well 2, the $N^+$ diffusion layers 3, the gate insulating film 11, and the polysilicon layer 9 form the varactor element.

In this conventional voltage controlled variable capacitance device, a voltage applied between the gate terminal 7 and the S/D terminal 8 is varied, thereby allowing the capacitance between the N well 2 and the polysilicon layer 9 to be varied. That is, when a positive potential is applied to the gate terminal 7 and a negative potential to the S/D terminal 8 to provide a sufficiently high voltage between both the terminals, electrons serving as carriers are collected near the gate insulating film 11 in the N well 2, placing the varactor element in an accumulation state. As a result, the varactor element becomes generally equal in capacitance to the gate insulating film 11 or to its maximum value. On the other hand, varying the gate terminal 7 toward a negative potential will cause a depletion layer to be formed immediately under the polysilicon layer 9 in the N well 2, and the extension of the depletion layer decreases the capacitance of the varactor element. A sufficiently lowered potential at the gate terminal 7 will drive the extension of the depletion layer into saturation. This allows no more decrease in capacitance and thus its minimum value to be reached.

As described above, the voltage controlled variable capacitance device employing the varactor element provides an advantage that it can be formed at the same time in a step of forming the N channel and P channel MOSFET in a semiconductor integrated circuit, without modifying the fabrication process of the semiconductor integrated circuit or adding a new process thereto.

However, the conventional voltage controlled variable capacitance device has the following problems. That is, the MOS varactor element is formed in the MOSFET fabrication process at the same time as the MOSFET and thus has the characteristics determined by the conditions for forming the MOSFET. However, when the varactor element is used to control the oscillation frequency of the VCO, it is preferable to optimally adjust the dependence of the gate-substrate capacitance on voltage, i.e., the C-V characteristic in accordance with the characteristics required of a circuit such as the VCO incorporated into the voltage controlled variable capacitance device. For example, a steep curve (C-V curve) showing the correlation between voltage and capacitance would make it difficult to control the oscillation frequency of the VCO. In addition, an increase in the ratio between the maximum and minimum capacitance (hereinafter referred to as the capacitance ratio) would provide an advantage of increasing the variable frequency range of the VCO. However, an excessively increased capacitance ratio would require such a transistor to be used as a transistor constituting the VCO, the transistor having an increased dependence of drain current on gate voltage (gm), resulting in an increase in phase noise or fluctuation in oscillation frequency.

For example, a method of varying the impurity concentration of the N well 2 shown in FIG. 1 is available only to vary the C-V characteristic of the voltage controlled variable capacitance device. FIG. 2 is a graph showing the C-V characteristic of a varactor element, the horizontal axis representing the gate—SD voltage and the vertical axis representing the gate—SD capacitance, with the impurity concentration of the N well 2 (see FIG. 1) being varied in the range of $1\times10^{17}$ to $1\times10^{18}$ $cm^{-3}$. As shown in FIG. 2, increasing the impurity concentration of the N well 2 from $1\times10^{17}$ to $1\times10^{18}$ $cm^{-3}$ causes the C-V curve to vary in the direction shown by arrow 31.

As described above, it is possible to increase the impurity concentration of the N well to thereby vary the C-V characteristic of the varactor element, for example, to provide a more gradual C-V curve. However, to optimally control the impurity concentration of the N well, an extra process is required for injecting an impurity to the N well, whereby the N well cannot be formed at the same time as the N well of the P channel MOSFET is formed. Otherwise, a modification would have to be made to the fabrication process of the P channel MOSFET, leading to a change in characteristic of the P channel MOSFET.

On the other hand, such a conventional technique is also disclosed in, e.g., Japanese Patent Laid-Open Publication No. 2002-43842, in which voltage drop means and a plurality of varactor elements are provided to allow the voltage drop means to generate multiple types of voltages, which were in turn applied to the varactor elements to thereby enable the ratio of change in capacitance to be set to a given value.

However, the aforementioned conventional technique has the following problems. The technique described in Japanese Patent Laid-Open Publication No. 2002-43842 requires the voltage drop means to be provided, thus raising a problem that the circuit becomes complicated in configuration and increased in size. Additionally, the circuit operates only with a sufficiently high control voltage, thus raising a problem of running counter to the attempt of lowering the operating voltage of the semiconductor integrated circuit.

SUMMARY OF THE INVENTION

It is an object of the present invention to provide a voltage controlled variable capacitance device which can be fabricated without modifying the conventional fabrication process or adding a new process thereto, and which allows for selecting a given C-V characteristic without an increase in size and voltage of the circuit.

A voltage controlled variable capacitance device according to the present invention includes a substrate, and one or more first varactor elements and one or more second varactor elements formed on a surface of the substrate and interconnected in parallel. Each of the first and second varactor elements includes a well formed on the surface of the substrate and connected to a first terminal, an insulating film formed on the well, and an electrode formed on the insulating film and connected to a second terminal, the insulating film being sandwiched between the well and the electrode. The thickness of the insulating film of the first varactor element is thinner than the thickness of the insulating film of the second varactor element. The number of the first and second varactor elements is set in accordance with a desired correlation between a voltage applied between the first terminal and the second terminal and a capacitance between the well and the electrode.

According to the present invention, the first and second varactor elements are each provided with the capacitance established by the well and the electrode. Accordingly, the insulating film of the first varactor element is made thinner in thickness than the insulating film of the second varactor element. This makes it possible for the correlation (hereinafter referred to as the C-V characteristic) between the capacitance and a voltage applied between the first and second terminals of the first varactor element to differ from the C-V characteristic of the second varactor element. Furthermore, a given number of first and second varactor elements can be interconnected in parallel, thereby allowing the C-V characteristic of the entire voltage controlled variable capacitance device to be arbitrarily selected.

On the other hand, the insulating film of the first and second varactor elements can be formed at the same time as the gate insulating film of a MOS transistor is formed in a semiconductor integrated circuit. This makes it possible to fabricate the voltage controlled variable capacitance device according to the present invention without modifying the existing fabrication process of the semiconductor integrated circuit or adding a new process thereto. Furthermore, the voltage controlled variable capacitance device according to the present invention can be formed only by connecting a plurality of varactor elements in parallel and thus requires no extra circuit other than the varactor element, thereby never causing the device to be increased in size and voltage.

Another voltage controlled variable capacitance device according to the present invention includes a substrate, and one or more first varactor elements and one or more second varactor elements formed on a surface of the substrate and interconnected in parallel. Each of the first and second varactor elements includes a well formed on the surface of the substrate and connected to a first terminal, an insulating film formed on the well, and an electrode formed on the insulating film and connected to a second terminal, the insulating film being sandwiched between the well and the electrode. The dielectric constant of a material forming the insulating film of the first varactor element is higher than the dielectric constant of a material forming the insulating film of the second varactor element. The number of the first and second varactor elements is set in accordance with a desired correlation between a voltage applied between the first terminal and the second terminal and a capacitance between the well and the electrode.

According to the present invention, the first and second varactor elements are each provided with the capacitance established by the well and the electrode. Accordingly, the material forming the insulating film of the first varactor element is made higher in dielectric constant than the material forming the insulating film of the second varactor element. This makes it possible to allow the C-V characteristic of the first varactor element to differ from that of the second varactor element. Furthermore, a given number of first and second varactor elements can be interconnected in parallel, thereby allowing the C-V characteristic of the entire voltage controlled variable capacitance device to be arbitrarily selected.

On the other hand, the insulating film of the first and second varactor elements can be formed at the same time as the gate insulating film of a MOS transistor is formed in a semiconductor integrated circuit. This makes it possible to fabricate the voltage controlled variable capacitance device according to the present invention without modifying the existing fabrication process of the semiconductor integrated circuit or adding a new process thereto. Furthermore, the voltage controlled variable capacitance device according to the present invention can be formed only by connecting a plurality of varactor elements in parallel and thus requires no extra circuit other than the varactor element, thereby never causing the device to be increased in size and voltage.

On the other hand, the voltage controlled variable capacitance device according to the present invention may be provided with a diffusion region formed in the surface of the well, the diffusion region being of the same conduction type as that of the well and connected to the first terminal. This allows the diffusion region to serve as the contact of the well, thereby ensuring the voltage applied to the first terminal to be transmitted to the well.

On the other hand, a voltage controlled variable capacitance device according to the present invention is incorporated in a semiconductor integrated circuit which includes a core portion for performing calculations and storing data, and an I/O portion for receiving and transmitting signals to and from an external circuit. The insulating film of the first varactor element may be formed at the same time as a gate electrode of a MOS transistor is provided in the core portion, while the insulating film of the second varactor element may also be formed at the same time as a gate electrode of a MOS transistor is provided in the I/O portion.

According to the present invention, the voltage controlled variable capacitance device is provided with a given number of first and second varactor elements, the insulating films of which are different from each other in thickness, and the first and second varactor elements are interconnected in parallel, thereby making it possible to arbitrarily select the entire C-V characteristic. In addition, the insulating films of the first and second varactor elements can be formed at the same time as the insulating film of the MOS transistor is formed in the other portion of the semiconductor integrated circuit. Thus, the voltage controlled variable capacitance device can be fabricated without modifying the existing fabrication process of the semiconductor integrated circuit or adding a new process thereto.

DETAILED DESCRIPTION OF THE PREFERRED EMBODIMENTS

Figure 3:
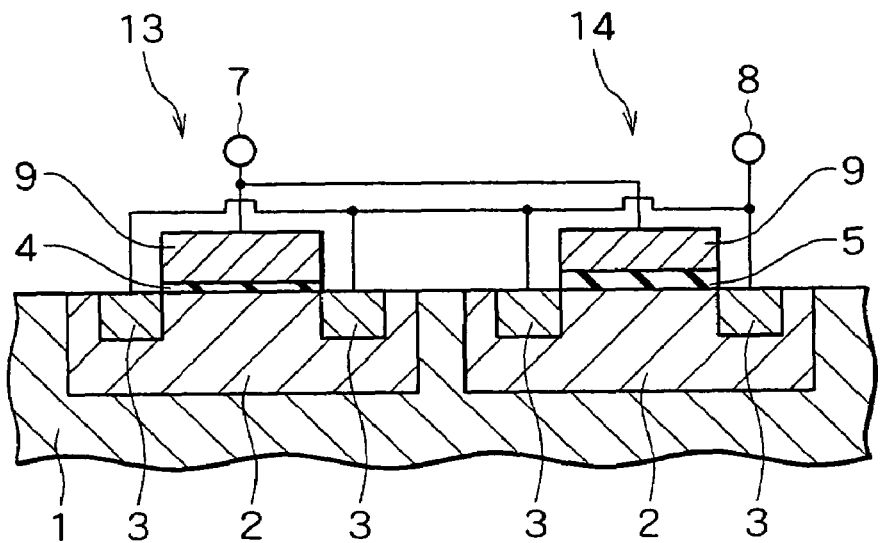
FIG. 3 is a cross-sectional view illustrating a voltage controlled variable capacitance device according to a first embodiment of the present invention.
Figure 4:
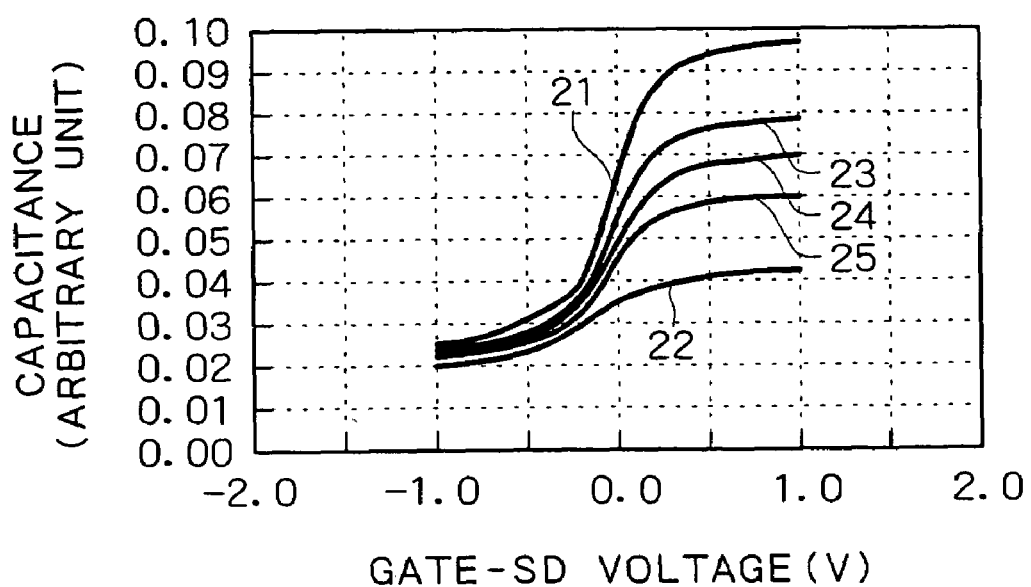
FIG. 4 is a graph showing the C-V characteristic of the voltage controlled variable capacitance device according to this embodiment, the horizontal axis representing the voltage of a gate terminal relative to an SD terminal, i.e., the gate—SD voltage and the vertical axis representing the gate—SD capacitance.

Now, the present invention will be explained below in more detail with reference to the accompanying drawings in accordance with the embodiments. To begin with, a first embodiment of the present invention will be described. FIG. 3 is a cross-sectional view illustrating a voltage controlled variable capacitance device according to the present invention. FIG. 4 is a graph showing the C-V characteristic of the voltage controlled variable capacitance device according to this embodiment, the horizontal axis representing the voltage of a gate terminal relative to an SD terminal, i.e., the gate—SD voltage and the vertical axis representing the gate—SD capacitance.

The voltage controlled variable capacitance device according to this embodiment is incorporated into a semiconductor integrated circuit. For example, this semiconductor integrated circuit is a logic LSI (Large Scale Integrated Circuit) and is provided with a core portion and an I/O portion. The core portion and the I/O portion have each an N channel MOSFET and a P channel MOSFET formed therein. The core portion mainly performs operations and stores data and is driven at a relatively low voltage such as about 1.3 to 1.8V. On the other hand, the I/O portion mainly serves as an interface to an exterior circuit and is driven at a relatively high voltage such as about 2.5 to 3.3V. For this reason, the gate insulating film of the MOSFET in the I/O portion is typically thicker than the gate insulating film of the MOSFET in the core portion.

As shown in FIG. 3, the voltage controlled variable capacitance device includes a plurality of MOS-type varactor elements. The voltage controlled variable capacitance device is provided with a boron (B) doped P type substrate 1 of silicon, on a surface of which provided is varactor elements 13 and 14. In FIG. 3, one varactor element 13 and one varactor element 14 are illustrated; however, a plurality of varactor elements 13 and/or 14 may also be provided.

The varactor element 13 has an N well 2 formed on the surface of the P type substrate 1. The N well 2 is formed when the N well of the P channel MOSFET is formed in the semiconductor integrated circuit. There is also provided a gate insulating film 4 on the N well 2. The gate insulating film 4 is formed at the same time as the gate insulating film of the N channel MOSFET is formed in the core portion of the semiconductor integrated circuit. For example, the gate insulating film 4 is made of silicon oxide film in a thickness of 2.6 nm. Furthermore, the gate insulating film 4 is provided on top thereof with a polysilicon layer 9 serving as a gate electrode. That is, the polysilicon layer 9 and the N well 2 are formed so as to sandwich the gate insulating film 4. For example, the polysilicon layer 9 is formed at the same time as the gate electrode of the N channel MOSFET is formed.

Furthermore, in the surface of the N well 2, there are formed $N^+$ diffusion layers 3 at two positions. The $N^+$ diffusion layers 3 are formed so as to sandwich the polysilicon layer 9 when viewed in the vertical direction. The $N^+$ diffusion layers 3 are formed at the same time as the source/drain of the N channel MOSFET is formed. When viewed in the vertical direction, the $N^+$ diffusion layers 3 are adjacent to the polysilicon layer 9. However, since the gate insulating film 4 is provided under the polysilicon layer 9, the $N^+$ diffusion layers 3 are insulated from the polysilicon layer 9 by the gate insulating film 4. The N well 2, the $N^+$ diffusion layers 3, the gate insulating film 4, and the polysilicon layer 9 make up the varactor element 13.

Likewise, the varactor element 14 has the N well 2 formed on the surface of the P type substrate 1 and a gate insulating film 5 on the N well 2. The gate insulating film 5 is formed at the same time as the gate insulating film of the N channel MOSFET is formed in the I/O portion of the semiconductor integrated circuit. For example, the gate insulating film 5 is made of silicon oxide film in a thickness of 6.0 nm. Furthermore, the gate insulating film 5 is provided on top thereof with the polysilicon layer 9 serving as the gate electrode. The components of the varactor element 14 other than those mentioned above are arranged in the same manner as those of the aforementioned varactor element 13.

For example, the gate length of the gate electrode made up of the polysilicon layer 9, i.e., the distance between the $N^+$ diffusion layers 3 is 0.25 to 1 μm, e.g., 1 μm. On the other hand, for example, the gate width, i.e., the length of the gate electrode in the direction perpendicular to the drawing of FIG. 3 is 2.5 to 5 μm, e.g., 5 μm.

In the varactor elements 13 and 14, the polysilicon layer 9 is connected to a gate terminal 7, while the $N^+$ diffusion layers 3 are connected to an S/D terminal 8. This allows the varactor elements 13 and 14 to be interconnected in parallel. In FIG. 3, the gate insulating films 4 and 5 are illustrated only immediately under the polysilicon layer 9. However, the gate insulating films 4 and 5 may also be formed in a region other than immediately under the polysilicon layer 9 so long as they do not prevent the $N^+$ diffusion layers 3 from connecting to the S/D terminal 8.

Now, a method for fabricating the voltage controlled variable capacitance device according to this embodiment will be described below. As shown in FIG. 3, first, the P type substrate 1 of silicon, doped with a P type impurity such as boron, is prepared. Then, the P type substrate 1 is doped with an N type impurity on a surface thereof to form a plurality of N wells 2 isolated from each other. FIG. 3 illustrates only two of the N wells 2 at two positions.

Then, the P type substrate 1 is subjected to the first oxidation treatment on the surface thereof so as to form a silicon oxide film (not shown) on the entire surface of the P type substrate 1, for example, in a thickness of 5.0 nm. Then, a photoresist (not shown) is formed to cover a region on which the gate insulating film 5 is to be formed. Subsequently, through etching using this photoresist as a mask, the silicon oxide film is removed from the surface of the P type substrate 1 other than the region on which the gate insulating film 5 is to be formed.

Then, the photoresist is removed, and the P type substrate 1 is subjected to the second oxidation treatment on the surface thereof. The second oxidation treatment is carried out under the conditions that allow a silicon oxide film to be formed, for example, in a thickness of 2.6 nm on the exposed surface of the P type substrate 1. At this time, at the region on which the gate insulating film 5 is to be formed, the silicon oxide film formed through the first oxidation treatment further grows, for example, to a thickness of 6.0 nm. On the other hand, at the region on which the gate insulating film 4 is to be formed, the silicon oxide film is 2.6 nm in thickness, for example. Thus, on the surface of the P type substrate 1, the gate insulating film 4 of silicon oxide film is formed, for example, in a thickness of 2.6 nm, while the gate insulating film 5 of silicon oxide film is formed in a thickness of 6.0 nm, for example.

Then, a polysilicon layer is formed and patterned to form the polysilicon layer 9 serving as a gate electrode on a predetermined region on the gate insulating films 4 and 5. Then, using the polysilicon layer 9 as a mask, the P type substrate 1 is selectively doped with an N type impurity on the surface thereof, such that the N$^+$ diffusion layers 3 are formed at the two regions that sandwich the polysilicon layer 9 in each N well 2 when viewed in the vertical direction. At this time, the polysilicon layer 9 forming the gate electrode is also doped with the N type impurity.

Then, the gate terminal 7 is connected to the polysilicon layer 9 serving as the gate electrode and the S/D terminal 8 is connected to the N$^+$ diffusion layers 3, thereby forming the voltage controlled variable capacitance device shown in FIG. 3.

Figure 1:
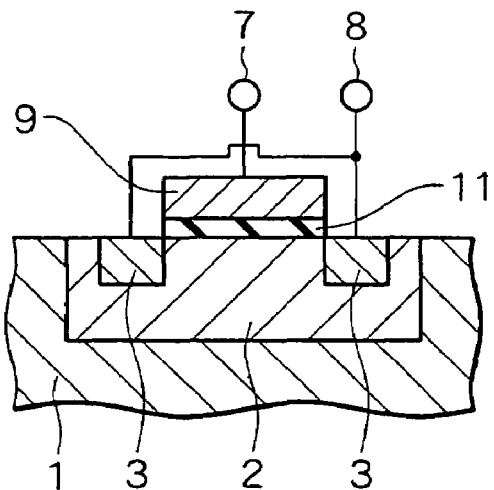
FIG. 1 is a cross-sectional view illustrating a prior art voltage controlled variable capacitance device.
Figure 2:
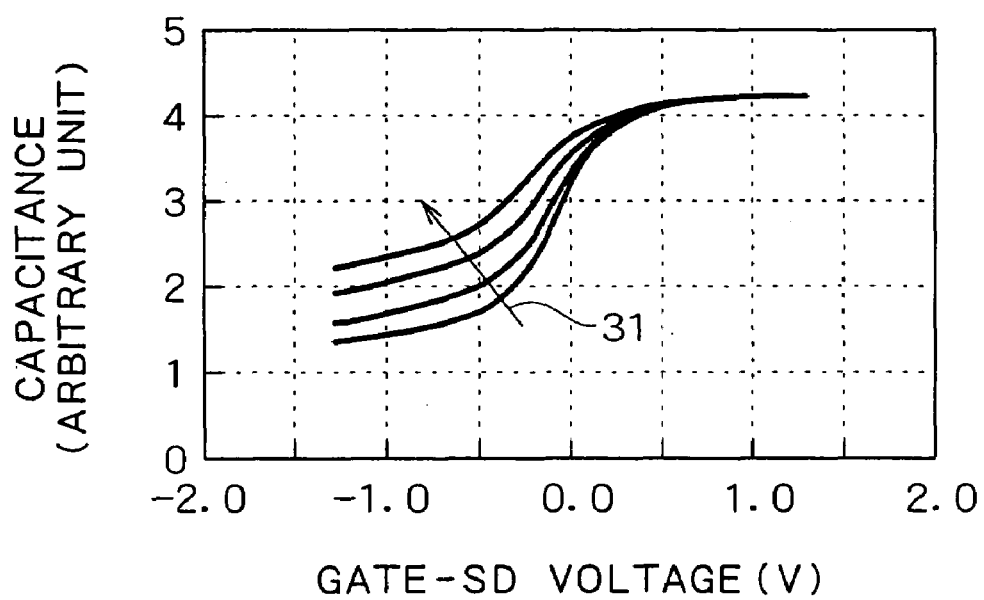
FIG. 2 is a graph showing the C-V characteristic of a varactor element, the horizontal axis representing the gate—SD voltage and the vertical axis representing the gate—SD capacitance, with the impurity concentration of an N well being varied.

Now, the operation of the voltage controlled variable capacitance device according to this embodiment is explained below. Like the aforementioned voltage controlled variable capacitance device (see FIG. 1) with the conventional varactor element, the voltage controlled variable capacitance device according to this embodiment also varies the voltage applied between the gate terminal 7 and the S/D terminal 8, thereby making it possible to vary the capacitance between the N well 2 and the polysilicon layer 9.

Referring to FIG. 4, line 21 represents the C-V curve of the varactor element 13. As described above, the varactor element 13 is provided with the gate insulating film 4 of silicon oxide film formed in a thickness of 2.6 nm, for example. On the other hand, line 22 represents the C-V curve of the varactor element 14. The varactor element 14 is provided with the gate insulating film 5 of silicon oxide film formed in a thickness of 6.0 nm, for example. As can be seen from the foregoing, the gate insulating film 5 of the varactor element 14 (e.g., 6.0 nm in thickness) is thicker than the gate insulating film 4 of the varactor element 13 (e.g., 2.6 nm in thickness). Therefore, the gate—SD voltage, i.e., the voltage of the gate electrode relative to the SD terminal is sufficiently low, and the varactor element 14 is generally equal in capacitance to the varactor element 13 when a thick depletion layer is formed immediately under the gate insulating film. However, suppose that the gate—SD voltage becomes sufficiently high in an accumulation state such that the capacitance of the varactor element becomes generally equal to that of the gate insulating film. In this case, since the gate insulating film 5 of the varactor element 14 is thicker than the gate insulating film 4 of the varactor element 13, the capacitance of the varactor element 14 becomes lower than that of the varactor element 13. This causes the gradient of the C-V curve (line 22) of the varactor element 14 becomes less than that of the C-V curve (line 21) of the varactor element 13. The capacitance ratio of the varactor element 14 becomes less than that of the varactor element 13.

Line 24 shows the C-V curve of the entire voltage controlled variable capacitance device in which one varactor element 13 and one varactor element 14 are connected in parallel. However, to compare the C-V curve (line 24) of the entire voltage controlled variable capacitance device with the C-V curve (line 21) of a single varactor element 13 and the C-V curve (line 22) of a single varactor element 14, the line 24 represents a capacitance a half times that represented by the lines 21 and 22. As shown in FIG. 4, the line 24 is positioned halfway between the line 21 and the line 22. Thus, the capacitance ratio and the gradient of the C-V curve provided by one varactor element 13 and one varactor element 14 being connected in parallel to each other take on values intermediate between those provided by the single varactor element 13 and the single varactor element 14.

On the other hand, line 23 shown in FIG. 4 represents two varactor elements 13 and one varactor element 14 connected in parallel to each other. Line 25 represents one varactor element 13 and two varactor elements 14 connected in parallel to each other. However, the lines 23 and 25 represent a capacitance one third times that of the lines 21 and 22. As shown in FIG. 4, the line 23 is located in between the line 21 and the line 24, while the line 25 is located in between the line 24 and the line 22.

As described above, this embodiment is arranged such that the gate insulating film 4 of the varactor element 13 is thinner than the gate insulating film 5 of the varactor element 14, and the number of the varactor elements 13 and 14, interconnected in parallel, is selected. This arrangement makes it possible to select the C-V characteristic of the voltage controlled variable capacitance device, especially, the gradient of the C-V curve at the maximum capacitance and within the voltage range in which the capacitance is greatly varied.

Furthermore, the gate insulating film 4 of the varactor element 13 is formed at the same time as the gate insulating film of the MOSFET is formed in the core portion of a semiconductor integrated circuit in which the varactor element 13 is formed. In addition, the gate insulating film 5 of the varactor element 14 is formed at the same time as the gate insulating film of the MOSFET is formed in the I/O portion of the semiconductor integrated circuit. This makes it possible to fabricate the voltage controlled variable capacitance device according to this embodiment without modifying the existing process or adding a new process thereto.

Furthermore, this embodiment makes it possible to form a voltage controlled variable capacitance device only by connecting one or more varactor elements 13 and 14 in parallel, requiring no extra circuit, other than the varactor element, such as the voltage drop means described in Japanese Patent Laid-Open Publication No. 2002-43842. Accordingly, the voltage controlled variable capacitance device will never be increased in size and in voltage.

Still furthermore, the voltage controlled variable capacitance device according to this embodiment is provided with the N$^+$ diffusion layers 3 in the surface of the N well 2. This arrangement allows the N$^+$ diffusion layers 3 to serve as the contact of the N well 2, thereby ensuring the voltage applied to the S/D terminal 8 to be transmitted to the N well 2.

In this embodiment, a silicide may also be formed on the surface of the polysilicon layer 9. Alternatively, the polysilicon layer 9 may also be provided on top thereof with a low resistance layer of a material having a lower resistivity than that of the polysilicon layer 9. This allows the resistance between the gate terminal 7 and the polysilicon layer 9 to be reduced, thereby further ensuring the voltage applied to the gate terminal 7 to be transmitted to the polysilicon layer 9.

Suppose that only the varactor element 13 or only the varactor element 14 is used to form the voltage controlled variable capacitance device. Even in this case, a plurality of varactor elements 13 or 14 may be provided and interconnected in parallel. This allows for reducing parasitic resistance with the capacitance per unit area remaining unchanged, when compared with a voltage controlled variable capacitance device formed by incorporating one varactor element 13 or 14. As a result, it is possible to improve the Q value of the voltage controlled variable capacitance device.

Furthermore, the varactor element forming the voltage controlled variable capacitance device is not limited to an accumulation mode varactor element. Thus, for example, a depletion mode varactor element may also be employed.

Figure 5:
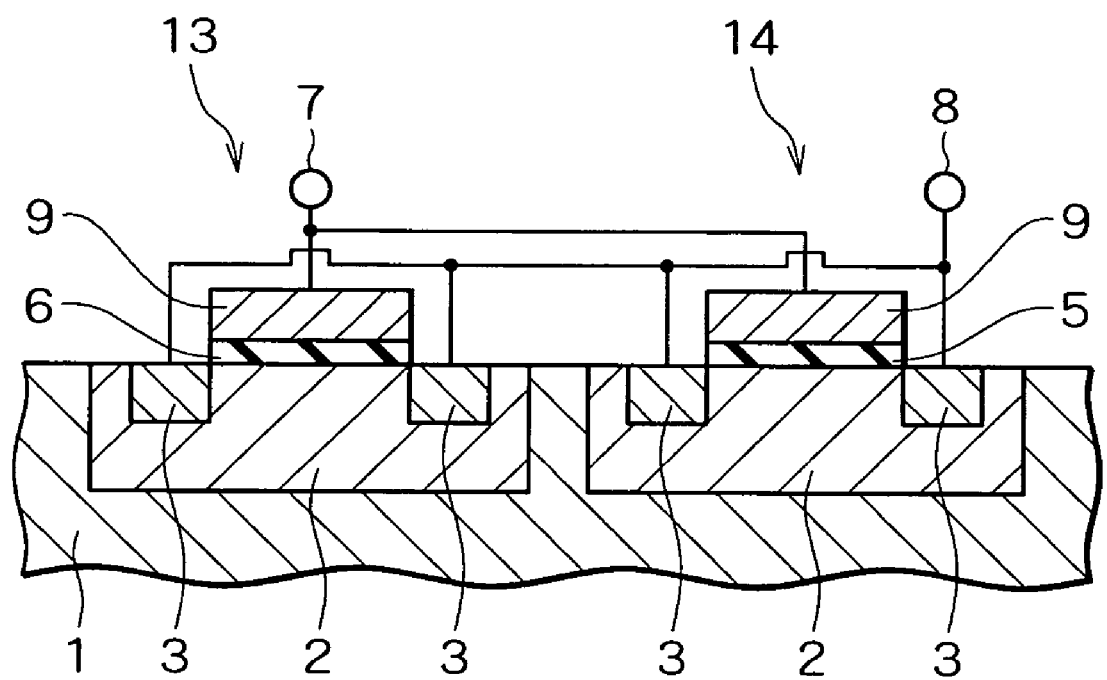
FIG. 5 is a cross-sectional view illustrating a voltage controlled variable capacitance device according to a second embodiment of the present invention.

Now, the present invention will be described in accordance with a second embodiment. FIG. 5 is a cross-sectional view illustrating a voltage controlled variable capacitance device according to this embodiment. As shown in FIG. 5, the voltage controlled variable capacitance device according to this embodiment is different from the aforementioned voltage controlled variable capacitance device of the first embodiment in that a gate insulating film 6 is provided, which is made of silicon oxide nitride film and the same as the gate insulating film 5 in thickness, instead of the gate insulating film 4 shown in FIG. 3. The other components in this embodiment are configured in the same manner as those of the aforementioned first embodiment.

Now, the operation of the voltage controlled variable capacitance device according to this embodiment will be explained below. Since the dielectric constant of silicon oxide nitride film is greater than that of silicon oxide film, the maximum capacitance of the varactor element 13 is greater than that of the varactor element 14. Accordingly, as shown in FIG. 4, like in the aforementioned first embodiment, this embodiment is designed such that the voltage controlled variable capacitance device with only the varactor element 13 has a C-V curve represented by line 21, the voltage controlled variable capacitance device with only the varactor element 14 has a C-V curve represented by line 22, and the voltage controlled variable capacitance device with the varactor elements 13 and 14 interconnected in parallel has C-V curves represented by lines 23 to 25.

This embodiment provides an advantageous effect that to separately form gate insulating films of silicon oxide film and of silicon oxide nitride film as the gate insulating film of a MOSFET in a semiconductor integrated circuit, the gate insulating film of the varactor element can be formed at the same time as these gate insulating films are formed. The other effects according to this embodiment other than that mentioned above are the same as those of the aforementioned first embodiment.

In this embodiment, the gate insulating films 5 and 6 may also be different in thickness from each other. Furthermore, any combination of materials can also be employed to form the gate insulating films 5 and 6 without being limited to silicon oxide film or silicon oxide nitride film as long as the materials are different from each other in dielectric constant and used as a material for forming the semiconductor integrated circuit.

Furthermore, the aforementioned first and second embodiments are arranged such that the number of varactor elements interconnected in parallel is selected at the time of circuit design of the voltage controlled variable capacitance device; however, the present invention is not limited thereto. That is, the embodiments may also be arranged such that a more than necessary number of varactor elements may be provided at the time of design, and a switch is also provided between the varactor elements, so that the switches are opened or closed to thereby select the number of varactor elements to be connected in parallel. This allows for providing redundancy for the number of varactor elements, thereby making it possible to change the C-V characteristic of the voltage controlled variable capacitance device in use.

What is claimed is:

1. A voltage controlled variable capacitance device comprising:
   a substrate; and
   one or more first varactor elements and one or more second varactor elements formed on a surface of said substrate and interconnected in parallel, each of said first and second varactor elements including:
   a well formed on the surface of said substrate and connected to a first terminal;
   an insulating film formed on said well; and
   an electrode formed on said insulating film and connected to a second terminal, said insulating film being sandwiched between said well and said electrode, wherein the thickness of said insulating film of said one or more first varactor elements are thinner than the thickness of said insulating film of said one or more second varactor elements, and the number of said one or more first and second varactor elements is set in accordance with a desired correlation between a voltage applied between said first terminal and said second terminal and a capacitance between said well and said electrode.

2. The voltage controlled variable capacitance device according to claim 1, wherein a diffusion region is formed in the surface of said well, said diffusion region being of the same conduction type as that of said well and connected to said first terminal.

3. The voltage controlled variable capacitance device according to claim 2, wherein said diffusion region is formed at two positions so as to sandwich said electrode, when viewed in a direction perpendicular to the surface of said substrate.

4. The voltage controlled variable capacitance device according to claim 1, wherein said substrate is a semiconductor substrate having a conduction type different from that of said well.

5. The voltage controlled variable capacitance device according to claim 1, including one of said one or more first varactor elements and one of said one or more second varactor elements.

6. The voltage controlled variable capacitance device according to claim 1, wherein said one or more first varactor elements includes a plurality of first varactor elements, and said one or more second varactor elements includes a plurality of second varactor elements, and said voltage controlled variable capacitance device including two of said plurality of first varactor elements or two of said plurality of second varactor elements, with the other being one in number.

7. The voltage controlled variable capacitance device according to claim 1, wherein said voltage controlled variable capacitance device is incorporated in a semiconductor integrated circuit which includes a core portion for performing calculations and storing data, and an I/O portion for receiving and transmitting signals to and from an external circuit, and said insulating film of said one or more first varactor element is formed at the same time as a gate electrode of a MOS transistor is provided in said core portion, and said insulating film of said one or more second varactor element is formed at the same time as a gate electrode of a MOS transistor is provided in said I/O portion.

8. A voltage controlled variable capacitance device comprising:
   a substrate; and
   one or more first varactor elements and one or more second varactor elements formed on a surface of said substrate and interconnected in parallel, each of said first and second varactor elements including:
      a well formed on the surface of said substrate and connected to a first terminal,
      an insulating film formed on said well, and
      an electrode formed on said insulating film and connected to a second terminal, said insulating film being sandwiched between said well and said electrode, wherein the dielectric constant of a material forming said insulating film of said first varactor element is higher than the dielectric constant of a material forming said insulating film of said second varactor element, and the number of said first and second varactor elements is set in accordance with a desired correlation between a voltage applied between said first terminal and said second terminal and a capacitance between said well and said electrode.

9. The voltage controlled variable capacitance device according to claim 8, wherein a diffusion region is formed in the surface of said well, said diffusion region being of the same conduction type as that of said well and connected to said first terminal.

10. The voltage controlled variable capacitance device according to claim 9, wherein said diffusion region is formed at two positions so as to sandwich said electrode, when viewed in a direction perpendicular to the surface of said substrate.

11. The voltage controlled variable capacitance device according to claim 8, wherein said substrate is a semiconductor substrate having a conduction type different from that of said well.

12. The voltage controlled variable capacitance device according to claim 8, including one first varactor element and one second varactor element.

13. The voltage controlled variable capacitance device according to claim 8, including two first varactor elements or two second varactor elements, with the other being one in number.

14. The voltage controlled variable capacitance device according to claim 8, wherein said voltage controlled variable capacitance device is incorporated in a semiconductor integrated circuit which includes a core portion for performing calculations and storing data, and an I/O portion for receiving and transmitting signals to and from an external circuit, and said insulating film of said first varactor element is formed at the same time as a gate electrode of a MOS transistor is provided in said core portion, and said insulating film of said second varactor element is formed at the same time as a gate electrode of a MOS transistor is provided in said I/O portion.

15. A voltage controlled variable capacitance device comprising:
   a substrate; and
   one or more first varactor elements and one or more second varactor elements formed on a surface of said substrate and interconnected in parallel, each of said first and second varactor elements including:
      a well formed on the surface of said substrate and connected to a first terminal;
      an insulating film formed on said well; and
      an electrode formed on said insulating film and connected to a second terminal, said insulating film being sandwiched between said well and said electrode, wherein the C-V curve of said first varactor element and the C-V curve of said second varactor element are different, and the number of said first and second varactor elements is set in accordance with a desired correlation between a voltage applied between said first terminal and said second terminal and a capacitance between said well and said electrode.

16. The voltage controlled variable capacitance device according to claim 15, wherein the thickness of said insulating film of said first varactor element is thinner than the thickness of said insulating film of said second varactor element.

17. The voltage controlled variable capacitance device according to claim 15, wherein the dielectric constant of a material forming said insulating film of said first varactor element is higher than the dielectric constant of a material forming said insulating film of said second varactor element.

* * * * *